United States Patent [19]

Inoue et al.

[11] Patent Number: 4,868,920

[45] Date of Patent: Sep. 19, 1989

[54] MESFET DEVICE FORMED ON A SEMI-INSULATIVE SUBSTRATE

[75] Inventors: Kazuhiko Inoue, Yokohama; Toru Suga, Tokyo, both of Japan

[73] Assignee: Kabushiki Kaisha Toshiba, Kawasaki, Japan

[21] Appl. No.: 172,443

[22] Filed: Mar. 24, 1988

[30] Foreign Application Priority Data

Mar. 31, 1987 [JP] Japan .................................. 62-78525

[51] Int. Cl.4 ...................... H01L 29/80; H01L 23/52
[52] U.S. Cl. ........................................ 357/22; 357/15; 357/68; 357/53
[58] Field of Search ...................... 357/22 R, 22 I, 15, 357/68, 53, 84

[56] References Cited

U.S. PATENT DOCUMENTS

| | | | |
|---|---|---|---|
| 4,219,827 | 8/1980 | Kaiser | 357/52 |
| 4,315,272 | 2/1982 | Vorhaus | 357/15 |
| 4,409,608 | 10/1983 | Yoder | 357/68 |
| 4,498,093 | 2/1985 | Allyn | 357/15 |
| 4,656,055 | 4/1987 | Dwyer | 357/52 |
| 4,737,837 | 4/1988 | Lee | 357/15 |

*Primary Examiner*—William D. Larkins
*Assistant Examiner*—Mark Prenty
*Attorney, Agent, or Firm*—Finnegan, Henderson, Farabow, Garrett, & Dunner

[57] ABSTRACT

A MESFET device includes a semi-insulative substrate, a source region, a drain region, a channel region, a source electrode, a drain electrode, a gate electrode, and a gate-electrode pad. The source region, drain region, and the channel region are formed in a surface region of the substrate. The three electrode and the gate-electrode pad are formed on the substrate. The MESFET device further comprises a conductive layer formed on the substrate and surrounds the source electrode and the gate-electrode pad. The conductive layer is connected to the drain electrode.

14 Claims, 5 Drawing Sheets

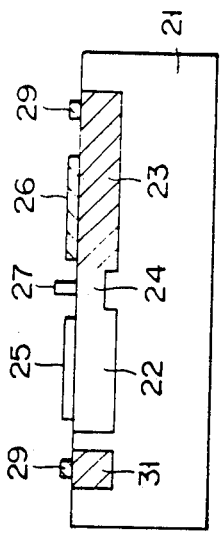
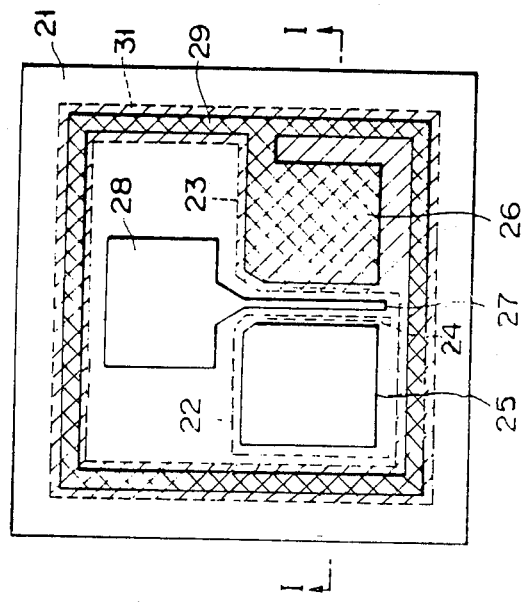

MESFET DEVICE FORMED ON A SEMI-INSULATIVE SUBSTRATE

BACKGROUND OF THE INVENTION

1. Field of the Invention

The present invention relates to a MESFET (Metal Semiconductor Field-effect Transistor) and, more particularly to, a MESFET formed on a semi-insulative GaAs substrate.

2. Description of the Related Art

A GaAs MESFET is well-known device which is formed on a GaAs substrate which is electrically semi-insulative. FIG. 1 shows a cross-sectinal view of the GaAs MESFET.

As is shown in FIG. 1, this FET comprises GaAs substrate 11, N+ source region 12 formed in the surface region of substrate 11, N+ drain region 13 formed in the surface region of substrate 11, and N channel region 14 connecting regions 12 and 13. Source electrode 15, drain electrode 16, and gate electrode 17 are formed on GaAs substrate 11. Source electrode 15 and drain electrode 16 are in ohmic contact with N+ source region 12 and N+ drain region 13, respectively. Gate electrode 17 is in Schottky contact with N channel region 14. Depletion layer 101 is formed in that portion of channel region 14 which is located right below gate electrode 17. The depth and width of this depletion layer are determined by the reverse bias voltage ($V_G$) applied to electrode 17. Depletion layer 102 is formed in the interface between GaAs substrate 11 and drain region 13.

Theoretically, a drain current $I_D$ of a certain value will flow in this GaAs MESFET when a predetermined DC bias voltage is applied between the gate and drain and also between the drain and source. Practically, however, the drain current fluctuates due to a excessive leak current $I_E$ (later described).

In FIG. 1, for simplicity of explanation, the arrows $I_D$ and $I_E$ represent the directions in which electrons move. The excessive leak current $I_E$ is generated as electrons or holes are generated in GaAs substrate 11. This excessive leak current $I_E$ has an AC component of 10 to 100 Hz.

Since drain region 13 has a potential higher than that of source region 12, the electrons generated in GaAs substrate 11 move into drain region 13 through depletion layer 102, in the form of excessive leak current $I_E$. As the electrons move through depletion layer 102, the width of layer 102 changes. Thus, the width of the channel region 14 changes. As a result, the drain current $I_D$ is modulated; it fluctuates. The fluctuation of the drain current $I_D$ is discussed in *Applied Physics Letter,* 41(10), November 1982, p. 989, and *Low Frequency Oscillation in GaAs IC's,* 1985 IEEE GaAs IC Symposium.

The fluctuation of the drain current $I_D$ results in the fluctuation of the high-frequency gain of the MESFET. Consequently, the total gain of a device containing the MESFET will change. For example, a TV tuner containing the MESFET described above will cause flicker on a TV screen.

SUMMARY OF THE INVENTION

It is accordingly the object of the present invention to provide a MESFET device whose drain current does not fluctuate.

According to the invention, there is provided a MESFET device comprising a semi-insulative substrate; a source region and a drain region, both formed in a surface region of the substrate, and spaced apart from each other; a channel region formed in that portion of the surface region of the substrate, which is located between the source region and the drain region; a source electrode formed on the source region and set in ohmic contact therewith; a drain electrode formed on the drain region and set in ohmic contact therewith; a gate electrode formed on the channel region and set in Schottky contact therewith; a gate-electrode pad formed on the substrate and connected to the gate electrode; a conductive layer formed on the substrate and surrounding the source electrode and the gate-electrode pad; and means for applying a bias voltage to the conductive layer, said bias voltage being equal to or higher than a bias voltage applied to the drain electrode.

The conductive layer absorbs most of the excessive leak current generated in the semi-insulative substrate. Therefore, only a small leak current flows into the drain region, whereby the drain current scarcely fluctuates.

BRIEF DESCRIPTION OF THE DRAWINGS

FIGS. 6A and 6B are a plan view and a sectional view, respectively, showing a MESFET device according to a fifth embodiment of the present invention.

DETAILED DESCRIPTION OF THE PREFERRED EMBODIMENTS

Figure 2A:
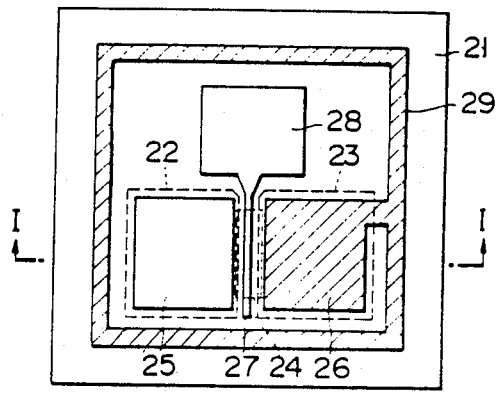
FIGS. 2A and 2B are a plan view and a sectional view, respectively, showing a MESFET device according to a first embodiment of the present invention.
Figure 2B:
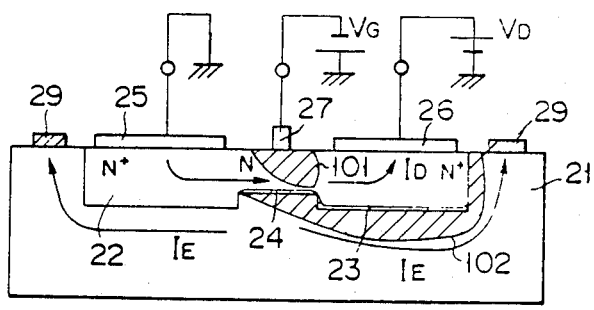

The MESFET device according to a first embodiment of the invention will be described, with reference to FIGS. 2A and 2B. FIG. 2A is a plan view of the MESFET device, and FIG. 2B shows a sectional view of the device, taken along line I—I in FIG. 2A. As is shown in these figures, N+ source region 22 and N+ drain region 23 are formed in the surface region of semi-insulative substrate 21 made of GaAs, and are spaced apart from each other. N channel region 24 is formed in that portion of the surface region of substrate 21, which is located between source region 22 and drain region 23. Regions 22, 23 and 24 have been formed by, for instance, injecting Si ions into selected portions of GaAs substrate 21, and by subsequently annealing GaAs substrate 21.

Source electrode 25 is formed on source region 22 and set in ohmic contact with region 22. Drain electrode 26 is formed on drain region 23 and set in ohmic contact with region 23. These electrodes 25 and 26 have been formed by depositing a metal such as Au or Ge on substrate 21 by means of lift-off process and then subjected to an alloying process. Gate electrode 27 is formed on channel region 24 and set in Schottky contact therewith. Gate-electrode pad 28 is formed on GaAs substrate 21 and connected to gate electrode 27. Gate electrode 27 has been formed by depositing a metal such as Ti or Al by means of lift-off process on substrate 21.

Conductive layer 29 is formed on GaAs substrate 21. This layer is connected to drain region 26, is ring-shaped, and surrounds source electrode 25 and gate-electrode pad 28. Conductive layer 29 can be made of the same material as drain electrode 26 and, thus, be formed simultaneously along with drain electrode 26.

Since conductive layer 29 is connected to drain electrode 26, it has the same potential as the bias voltage $V_D$ applied to drain electrode 26. Therefore, the excessive leak current $I_E$ flows from GaAs substrate 21 to conductive layer 29, is blocked by depletion layer 102, and scarcely flows to drain electrode 26. Hence, the drain current $I_D$ is not modulated by the excessive leak current $I_E$, and does not fluctuate.

Figure 1:
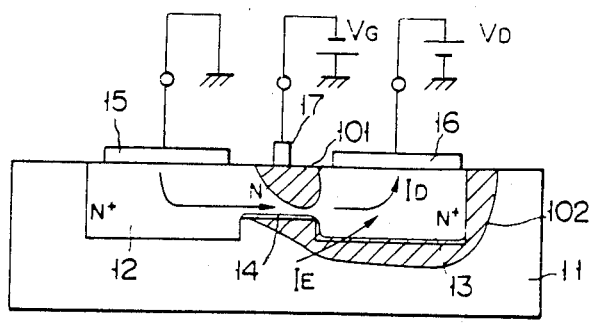
FIG. 1 is a sectional view showing a conventional MESFET device.
Figure 3:
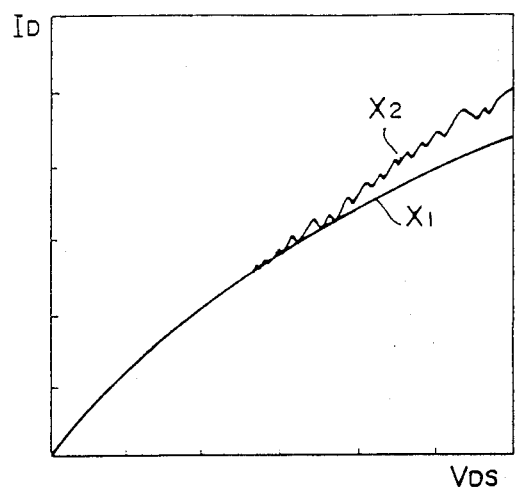
FIG. 3 is a graph representing the voltage-current characteristic of the MESFET device illustrated in in FIGS. 2A and 2B.

FIG. 3 represents the voltage-current characteristic of the MESFET device. In this figure, X1 is a curve showing the relationship between the drain current $I_D$ and the voltage applied the MESFET device, and X2 is a curve representing the relationship between the drain current $I_D$ and the voltage applied the prior art MESFET device (FIG. 1). As can be understood from FIG. 3, the drain current $I_D$ of the MESFET device according to the present invention is not modulated by the exessive leak current $I_E$, owing to conductive layer 29.

Figure 4A:
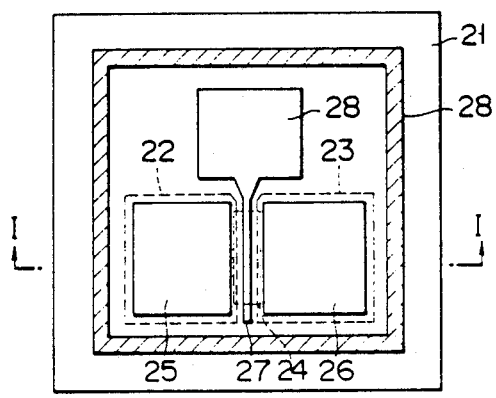
FIGS. 4A and 4B are a plan view and a sectional view, respectively, showing a MESFET device according to a second embodiment of the present invention.
Figure 4B:
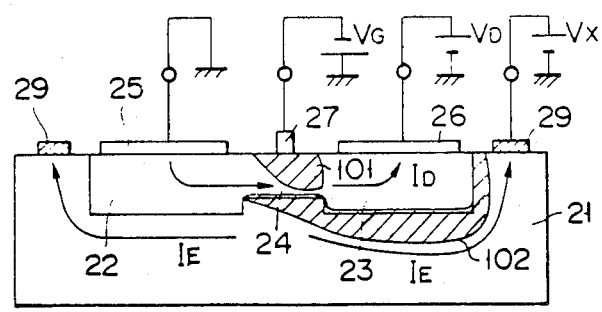

FIGS. 4A and 4B show an MESFET device according to a second embodiment of this invention. FIG. 4A is a plan view, and FIG. 4B is a sectional view, taken along line I—I in FIG. 4A. This MESFET device is identical with that shown in FIGS. 2A and 2B, except that conductive layer 29 is not connected to drain electrode 26, and a bias voltage $V_X$ is applied to conductive layer 29. The bias voltage $V_X$ is equal to, or higher than, the bias voltage $V_D$ applied to drain electrode 26. As in the first embodiment (FIGS. 2A and 2B), an excessive leak current $I_E$ flows to conductive layer 29, and scarcely flows to drain electrode 26. Hence, the drain current $I_D$ is not modulated by the excessive leak current $I_E$, and does not fluctuate.

Figure 5A:
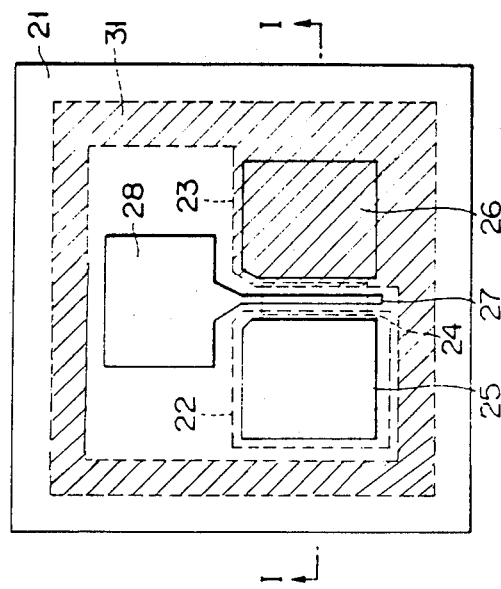
FIGS. 5A and 5B are a plan view and a sectional view, respectively, showing a MESFET device according to a third embodiment of the present invention.
Figure 5B:
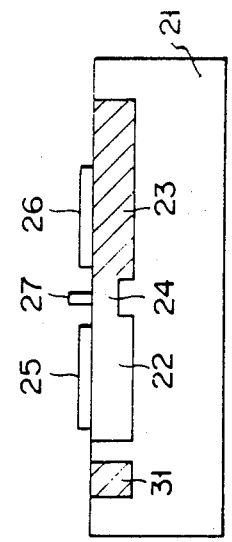

FIGS. 5A and 5B show an MESFET device according to a third embodiment of this invention. FIG. 5A is a plan view, and FIG. 5B is a sectional view, taken along line I—I in FIG. 5A. This MESFET device is characterized in that conductive layer 31 is formed in the surface region of GaAs substrate 21, so as to absorb an excessive leak current $I_E$. Conductive layer 31 is connected to drain region 23, and is ring-shaped, surrounding source region and drain-electrode pad 28, as is illustrated in FIG. 5A. Conductive layer 31 can a N+ doped layer, and can therefore be formed simultaneously with drain region 23.

FIGS. 6A and 6B show an MESFET device according to a fourth embodiment of this invention. FIG. 6A is a plan view, and FIG. 6B is a sectional view, taken along line I—I in FIG. 6A. This MESFET device is characterized in that conductive layer 31 is formed in the surface region of GaAs substrate 21, and conductive layer 29 is formed on GaAs substrate 21. The potential of conductive layer 31 is reduced due to an leak. Nonetheless, a voltage drop at conductive layer 31 is prevented by conductive layer 29 which is made of a metal. Thus, conductive layer 31 can absorb the current $I_E$ more efficiently than layer 31 incorporated in the third embodiment (FIGS. 5A and 5B).

Figure 7A:
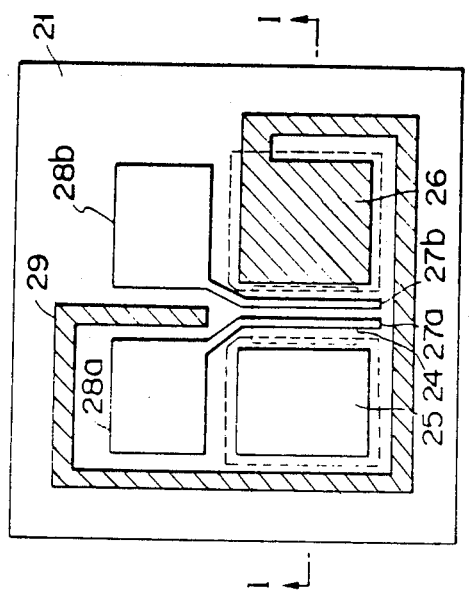
FIGS. 7A and 7B are a plan view and a sectional view, respectively, showing a MESFET device according to a sixth embodiment of the present invention.
Figure 7B:
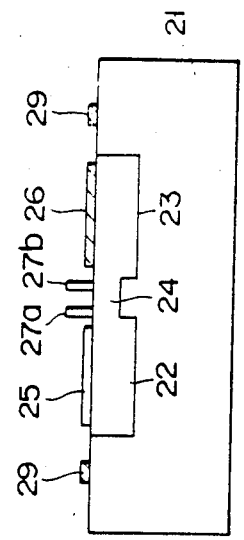

FIGS. 7A and 7B show a dual-gate MESFET device according to a fifth embodiment of this invention. FIG. 7A is a plan view, and FIG. 7B is a sectional view, taken along line I—I in FIG. 6A. Two gate electrodes 27a and 27b are formed on GaAs substrate 21, close to source electrode 25 and drain electrode 26, respectively. A reverse bias voltage, which is higher than the bias voltage applied to second gate electrode 27b, is applied to first gate electrode 27a. Therefore, more excessive leak current $I_E$ is generated within that portion of GaAs substrate 21 which is adjacent to first gate-electrode pad 28a than in that other portion of substrate 21 which is adjacent to second gate-electrode pad 28b. Hence, conductive layer 29, which is used to absorb the excessive leak current $I_E$, need not be shaped so as to surround both pads 28a and 28b, source region 25, and drain region 25. The fluctuation of the drain current $I_D$ can be sufficiently suppressed only if layer 29 surrounds region 25 and pad 28a.

All embodiments described above have a GaAs substrate. Nonetheless, the present invention can applied to a MESFET device having a semi-insulative substrate made of GaP or InAs.

What is claimed is:

1. A MESFET device comprising:
    a semi-insulative substrate;
    a source region and a drain region, both formed in a surface region of said substrate, and spaced apart from each other;
    a channel region formed in that portion of the surface region of said substrate, which is located between said source region and said drain region;
    a source electrode formed on said source region and set in ohmic contact therewith;
    a drain electrode formed on said drain region and set in ohmic contact therewith;
    a gate electrode formed on said channel region and set in Schottky contact therewith;
    a gate-electrode pad formed on said substrate and connected to said gate electrode;
    a conductive layer formed on said substrate and surrounding said source electrode and the gate-electrode pad; and
    voltage-applying means for applying a bias voltage to said conductive layer, said bias voltage being equal to a bias voltage applied to said drain electrode.

2. The MESFET device according to claim 1, wherein said voltage-applying means includes means for electrically connecting said drain electrode and said conductive layer.

3. The MESFET device according to claim 1, wherein said conductive layer is formed on said semi-insulative substrate.

4. The MESFET device according to claim 1, wherein said conductive layer is formed in a surface region of said semi-insualtive substrate.

5. The MESFET device according to claim 1, wherein said conductive layer is formed, partly on said semi-insulative substrate, and partly in a surface region of said semi-insulative substrate.

6. The MESFET device according to claim 3, 4, or 5, wherein said conductive layer is ring-shaped and surrounds said source electrode and said gate-electrode pad.

7. The MESFET device according to claim 1, wherein said semi-insulative substrate is a GaAs substrate.

8. A MESFET device comprising:
a semi-insulative substrate;
a source region and a drain region, both formed in a surface region of said substrate, and spaced apart from each other;
a channel region formed in that portion of the surface region of said substrate, which is located between said source region and said drain region;
a source electrode formed on said source region and set in ohmic contact therewith;
a drain electrode formed on said drain region and set in ohmic contact therewith;
a gate electrode formed on said channel region and set in Schottky contact therewith;
a gate-electrode pad formed on said substrate and connected to said gate electrode;
a conductive layer formed on said substrate and surrounding said source electrode and the gate-electrode pad; and
voltage-applying means for applying a bias voltage to said conductive layer, said bias voltage being higher than a bias voltage applied to said drain electrode.

9. The MESFET device according to claim 8, wherein said voltage-applying means includes means for applying a first bias voltage to said drain electrode and means for applying a second bias voltage higher than the first bias voltage, to said conductive layer.

10. The MESFET device according to claim 8, wherein said conductive layer is formed on said semi-insulative substrate.

11. The MESFET device according to claim 8, wherein said conductive layer is formed in a surface region of said semi-insulative substrate.

12. The MESFET device according to claim 8, wherein said conductive layer is formed, partly on said semi-insulative substrate, and partly in a surface region of said semi-insulative substrate.

13. The MESFET device according to claim 10, 11, or 12, wherein said conductive layer is ring-shaped and surrounds said source electrode and said gate-electrode pad.

14. The MESFET device according to claim 8, wherein said semi-insulative substrate is a GaAs substrate.

* * * * *